United States Patent [19]
Schreck et al.

[11] Patent Number: 5,157,280
[45] Date of Patent: Oct. 20, 1992

[54] SWITCH FOR SELECTIVELY COUPLING A POWER SUPPLY TO A POWER BUS

[75] Inventors: John F. Schreck; Phat C. Truong, both of Houston; Chirag Desai, Austin, all of Tex.

[73] Assignee: Texas Instruments Incorporated, Dallas, Tex.

[21] Appl. No.: 655,877

[22] Filed: Feb. 13, 1991

[51] Int. Cl.⁵ .............................................. H03K 17/10
[52] U.S. Cl. .............................. 307/296.5; 307/296.2; 365/189.09
[58] Field of Search ............... 307/475, 451, 264, 270, 307/482, 578, 585, 296.2, 296.5; 365/104, 226, 228, 189.09

[56] References Cited

U.S. PATENT DOCUMENTS

| | | | |
|---|---|---|---|
| 4,555,644 | 11/1985 | Devecchi et al. | 307/482 |
| 4,689,495 | 8/1987 | Liu | 307/264 |
| 4,716,303 | 12/1987 | Mimoto | 307/482 X |
| 4,716,313 | 12/1987 | Hori et al. | 307/270 X |
| 4,791,317 | 12/1988 | Winnerl et al. | 307/296.2 |
| 4,916,334 | 4/1990 | Minagawa et al. | 307/264 X |
| 5,045,716 | 9/1991 | Takacs et al. | 307/296.2 |

Primary Examiner—David Hudspeth
Attorney, Agent, or Firm—W. James Brady, III; Lawrence J. Bassuk; Richard L. Donaldson

[57] ABSTRACT

A switching circuit for selectively coupling a first power supply to a power bus includes a first input terminal for connection to the first power supply and a means for coupling said first input terminal to a first node. A first transistor has a first source/drain region coupled to the first node and a second source/drain region coupled to the power bus. The first transistor is on in response to a first control signal applied to its gate to couple the first node to the power bus. A bias circuit is coupled to the substrate of the first transistor to prevent forward biasing of a junction between its substrate and its second source/drain region when the first transistor is on.

12 Claims, 8 Drawing Sheets

SWITCH FOR SELECTIVELY COUPLING A POWER SUPPLY TO A POWER BUS

FIELD OF THE INVENTION

This invention generally relates to switching circuitry. More particularly, this invention relates to a switching circuit for selectively coupling a power supply to a power bus.

BACKGROUND OF THE INVENTION

Integrated circuits typically have a power bus which supplies power to internal circuitry. Often the internal circuitry is capable of performing a plurality of functions, with each of the functions having different power requirements. In such situations, the integrated circuit may be provided with a switch to selectively couple an appropriate one of a plurality of power supplies to the power bus.

An EPROM (electrically-programmable, read-only-memory) is one example of an integrated circuit having a plurality of power supplies which are selectively coupled to a power bus. An EPROM includes an array of floating-gate memory cells arranged in rows and columns. The floating gate of a programmed memory cell is charged with electrons, and the electrons in turn render the source-drain path under the charged floating gate nonconductive when a chosen row-line select voltage is applied to the control gate. The nonconductive state is read as a "zero" bit. The floating gate of a non-programmed cell is neutrally charged such that the source-drain path under the non-programmed floating gate is conductive when the same chosen row-line select voltage is applied to the control gate. The conductive state is read as a "one" bit.

Each column and row of an EPROM array may contain thousands of cells. The sources of cells in a column are connected to a virtual-ground line (source-column line). The drains of cells in a column are connected to a bitline (drain-column line). The control gates of each cell in a row are connected to a wordline.

During cell programming, appropriate programming voltages are applied to the selected control-gate wordline, the selected source-column line, and the selected drain-column line to create a high-current condition in the selected channel region, injecting channel-hot electrons and/or avalanche-breakdown electrons across the channel oxide to the floating gate.

During cell reading, appropriate reading voltages are applied to the selected control-gate wordline, the selected source-column line, and the selected drain-column line and the conductive or nonconductive state of the cell detected.

Appropriate programming and reading voltages are supplied to a selected wordline by a power bus. The power bus is selectively coupled by a power supply switch to a first high voltage power source during programming and to a second lower voltage power source during reading. Previous power supply switches have used field-effect transistors formed in the face of an integrated circuit.

SUMMARY OF THE INVENTION

It has been discovered that a parasitic bipolar transistor produced during fabrication of previous field-effect transistor power supply switches can become conductive when the power bus is coupled to a highly capacitive load. Under such circumstances, the parasitic bipolar transistor can conduct current intended for the power bus to the substrate or produce a condition known as latchup.

Generally, and in one form of the invention, a switching circuit for selectively coupling a first power supply to a power bus includes a first input terminal for connection to the first power supply and a means for coupling said first input terminal to a first node. A first transistor has a first source/drain region coupled to the first node and a second source/drain region coupled to the power bus. The first transistor is on in response to a first control signal applied to its gate to couple the first node to the power bus. A bias circuit is coupled to the substrate of the first transistor to prevent forward biasing of a junction between its substrate and its second source/drain region when the first transistor is on.

An advantage of the invention is that it prevents the parasitic bipolar transistor from turning on when the power bus is coupled to a highly capacitive load.

BRIEF DESCRIPTION OF THE DRAWINGS

In the drawings:

FIG. 4b is a substrate cross-section of the circuit of FIG. 4a;

FIG. 5b is a substrate cross-section of a portion of the circuit of FIG. 5a;

FIG. 6 is a waveform diagram of the input signals of the circuit of FIG. 5a.

Corresponding numerals and symbols in the different figures refer to corresponding parts unless otherwise indicated.

DETAILED DESCRIPTION OF PREFERRED EMBODIMENTS

Figure 1:
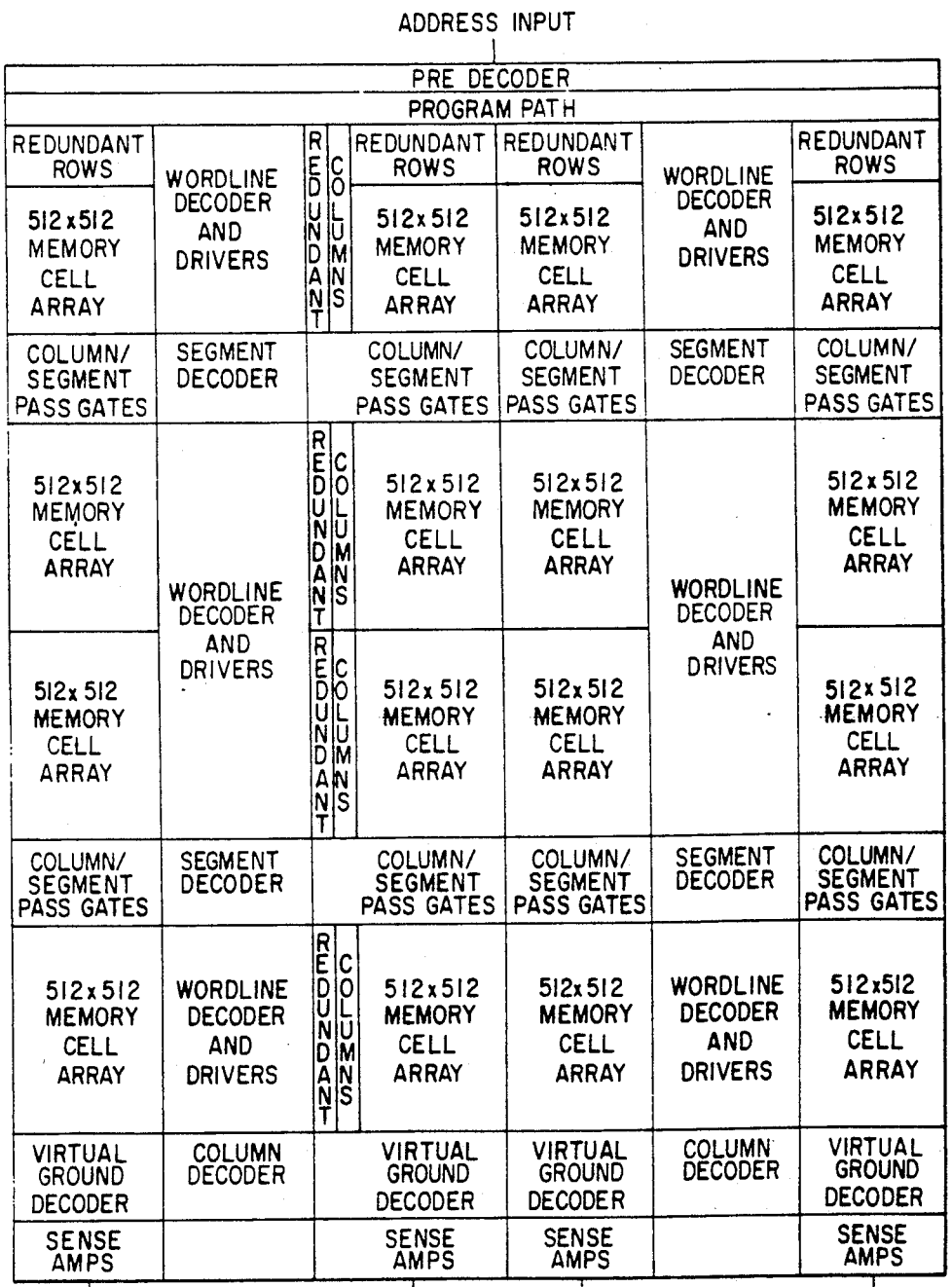
FIG. 1 is a block diagram of a four megabit EPROM in which the present invention may be used.

Referring to FIG. 1, an example of an integrated circuit layout for a nominal four megabit EPROM is illustrated. The layout, in which dimensional proportions are not those of actual manufacture, illustrates sixteen 512 by 512 memory sub-arrays with redundant rows and columns used to replace rows and columns having defective cells. Peripheral circuitry, including row decoders, column decoders, virtual-ground decoders, wordline drivers, and column/segment pass gates, functions to connect reading and programming voltages to the rows and columns of cells in response to address inputs routed through a pre-decoder and program path. Data is written into the memory arrays during programming operations. During reading operations, data from the memory arrays is routed through sense amplifiers to the output.

Figure 2:
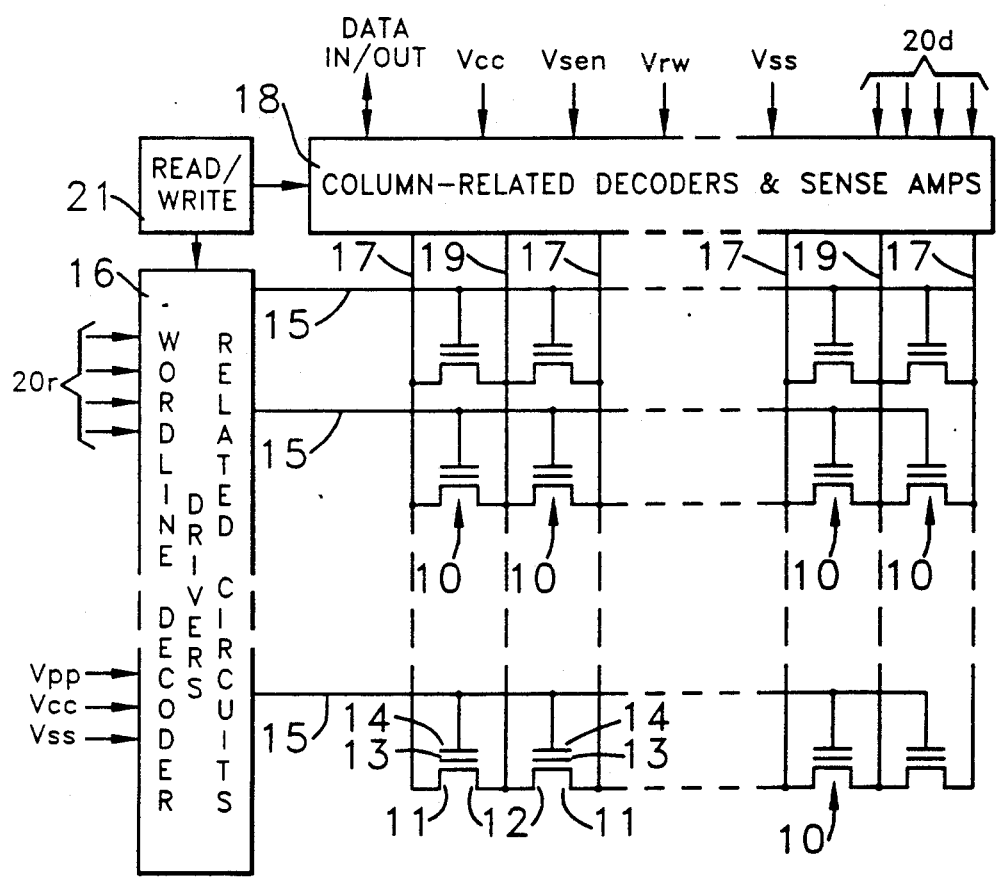
FIG. 2 is a block diagram of a part of a memory cell array and associated circuitry of the EPROM of FIG. 1.

Referring to FIG. 2, an example array of memory cells, which is a part of a memory chip such as that illustrated in FIG. 1, is shown. Each cell 10 is a floating gate transistor having a source 11, a drain 12, a floating gate 13 and a control gate 14. Each of the control gates 14 in a row of cells 10 is connected to a wordline 15, and each of the wordlines 15 is connected to a row decoder circuit 16. Each of the sources 11 in a column of cells 10 is connected to a source-column line 17 (which may be a virtual ground line), and each of the source-column lines 17 is connected to a column decoder circuit 18. Each of the drains 12 in a column of cells 10 is connected to a drain-column line 19, and each of the drain-column lines 19 is connected to the column decoder circuit 18.

In a write or program mode, row decoder circuit 16, in response to wordline address signals 20r and to signals from read/write control circuit 8, places a first preselected programming voltage Vpp (approximately +12.5 volts) on a selected wordline 15, including a control gate 14 of a selected memory cell 10. Deselected wordlines 15 are connected to reference potential Vss. Column decoder circuit 18, in response to bitline address signals 20d and to signals from read/write control circuit 8, places a second programming voltage Vrw (which may be Vpp reduced through an impedance to approximately +5 to +10 volts) on a selected source-column line 17 and, therefore, the source region 11 of the selected cell 10. Column decoder circuit 18 also connects a selected drain column line 19 to reference potential Vss. Deselected source-column lines 17 and deselected drain-column lines 19 are floated. These programming voltages create a high current (drain 12 to source 11) condition in the channel of the selected memory cell 10, resulting in the generation near the drain-channel junction of channel-hot electrons and avalanche-breakdown electrons that are injected across the channel oxide to the floating gate 13 of the selected cell 10. The programming time is selected to be sufficiently long to program the floating gate 13 with a negative program charge of approximately −2 volts to −6 volts with respect to the channel region. The injected electrons and negative program charge in turn render the source-drain path under the floating gate 13 of the selected cell 10 nonconductive, a state which is read as a "zero" bit. Deselected cells 10 have source-drain paths under the floating gate 13 that remain conductive, and those cells 10 are read as "one" bits.

Erasing of cells may be accomplished, for example, by ultraviolet radiation.

In the read mode, row decoder circuit 16, in response to wordline address signals 20r and to signals from read/write control circuit 8, applies a preselected positive voltage Vcc (approximately +3 volts to +5 volts) to the selected wordline 15 and thus to the selected control gate 14, and applies a low voltage (ground or Vss) to deselected wordlines 15. The column decoder circuit 18, in response to column address signals 20d and to signals from read/write control circuit 8, applies a positive voltage Vsen (approximately +1 volt to +1.5 volts) to the selected drain-column line 19. Deselected drain-column lines 19 are floated. Column decoder circuit 18 also connects all of the source-column lines 17 to ground or reference potential Vss except for the source-column line 17 sharing the same drain-column line connected to the cell 10 that is being read. That source-column line 17 is driven to the same voltage level as the selected drain-column line 19.

As is well known, the source 11 regions and the drain 12 regions of the memory cells 10 may be interchanged for the various modes of operation. Voltages applied to the source 11 and drain 12 regions in the read example above are interchangeable. Therefore, the terms "source" and "drain" as used herein are interchangeable for each mode of operation.

Figure 3:
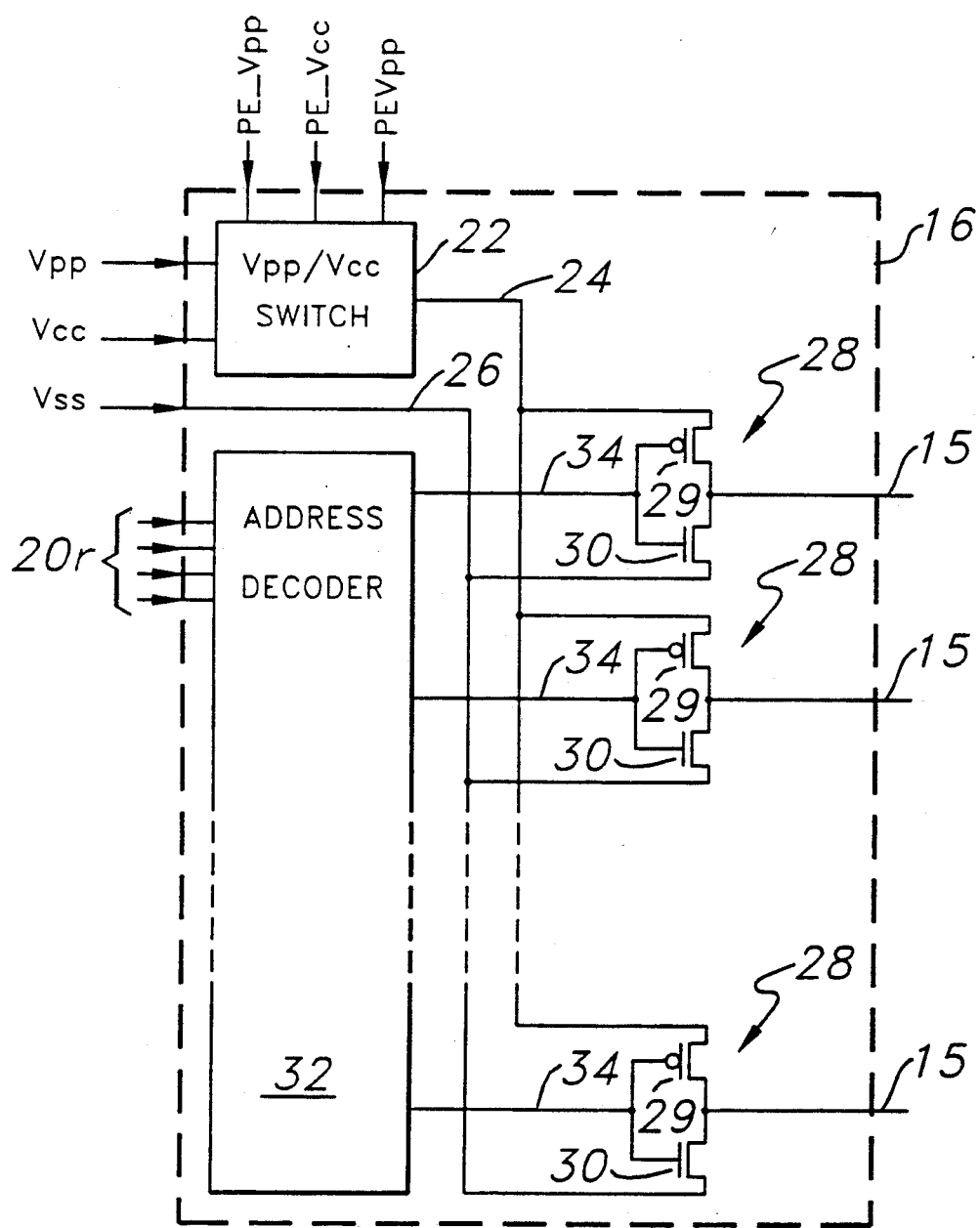
FIG. 3 is a block diagram of the row decoder circuit in the device of FIG. 2.

FIG. 3 shows circuit 16 of FIG. 2 in greater detail. Circuit 16 includes Vpp/Vcc power supply switch 22 that selectively couples either an external Vpp supply or external Vcc supply to power bus 24 in response to control signals PE_Vpp, PE_Vcc, and PEVpp received from read/write control circuit 21. Power bus 24 is connected to the p-channel transistor 29 of each driver circuit 28. A reference bus 26 connects reference supply Vss to the n-channel transistor 30 of each driver circuit 28. Each driver circuit 28 selectively couples an associated wordline 15 to either power bus 24 or reference bus 26 in response to a control signal on line 34.

Decoder 32 decodes address signals 20r that identify a selected wordline 15 and provides a logic "0" level control signal on the line 34 associated with the selected wordline 15. P-channel transistor 29 is on and n-channel transistor 30 is off in the driver circuit 28 which receives a logic "0" level control signal to connect the selected wordline 15 to power bus 24. Decoder 32 provides a logic "1" level control signal on the lines 34 associated with deselected wordlines 15. P-channel transistors 29 are off and n-channel transistors 30 are on in driver circuits 28 that receive a logic "1" level control signal to connect deselected wordlines 15 to reference bus 26.

Figure 4A:
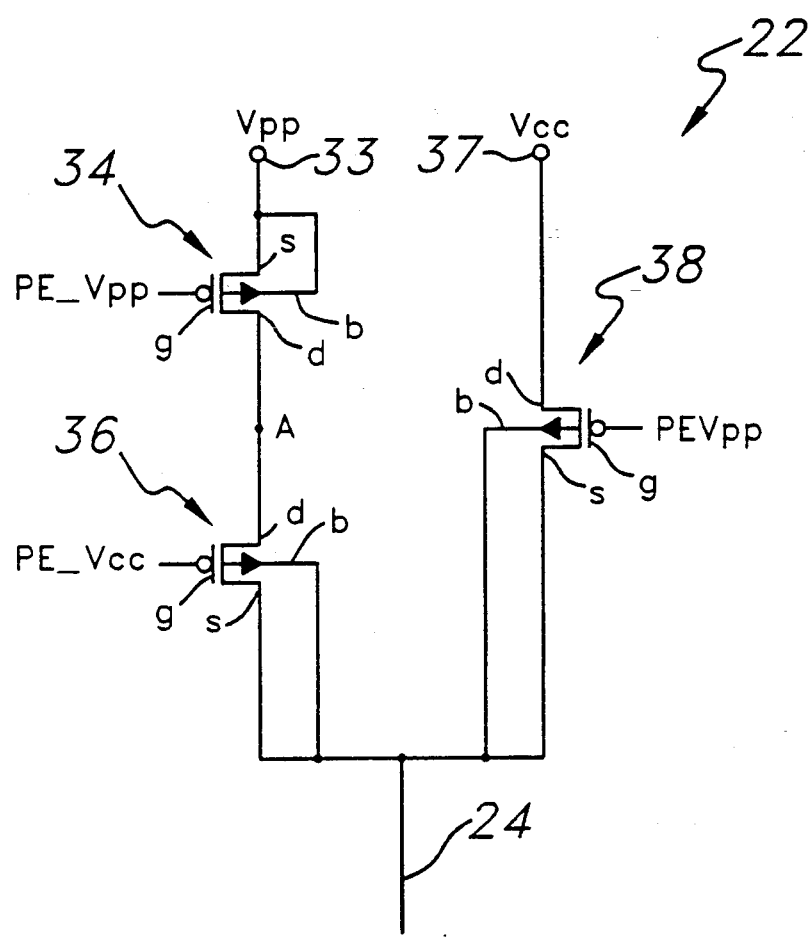
FIG. 4a is a schematic diagram of a prior art switching circuit.
Figure 6:
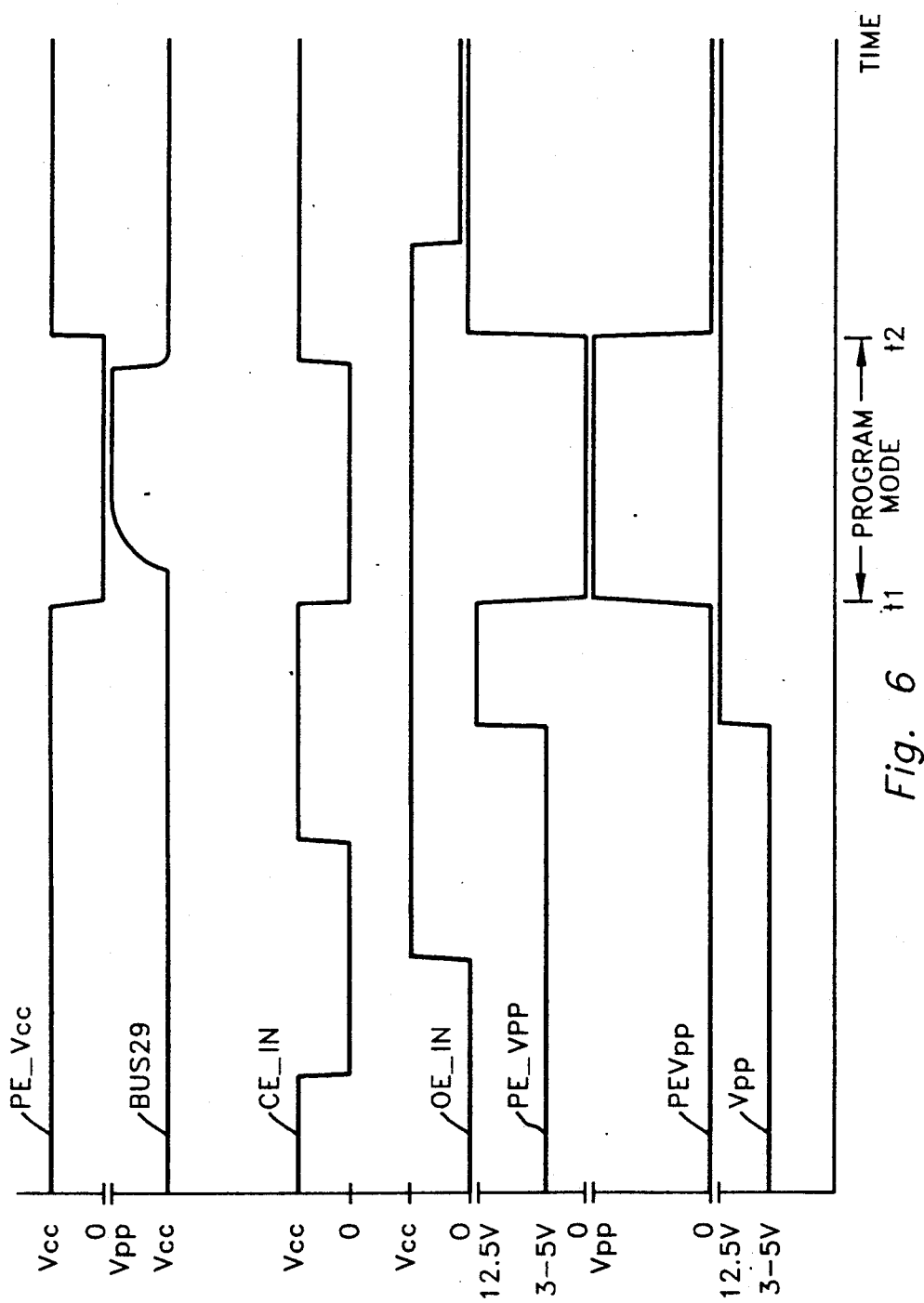

FIG. 4a shows a known Vpp/Vcc power supply switch 22 which includes a pair of p-channel MOS field effect transistors 34 and 36 having source-drain paths connected in series between input terminal 33 which is connected to Vpp and power bus 24 and a p-channel MOS field effect transistor 38 having a source-drain path connected between Vcc and power bus 24. Transistor 34 has its source, s, and substrate or bulk, b, connected together to Vpp and its drain, d, connected to node A. Gate, g, of transistor 34 receives a control signal PE_Vpp that has a value of 0 volts when the EPROM is in the program mode and a value equal to Vpp in all modes except for the programming mode. As seen in FIG. 6, Vpp in nonprogramming modes has a value of either approximately 3-5 volts or approximately 12.5 volts.

Transistor 36 has its drain, d, connected to node A and its source, s, and substrate or bulk, b, connected together to power bus 24. Gate, g, of transistor 36 receives a control signal PE_Vcc that has values of 0 volts in the program mode and approximately 3 to 5 volts in all modes except the programming mode.

Transistor 38 has its drain, d, connected to input terminal 37 which is connected to Vcc and its source, s, and substrate or bulk, b, connected together to power bus 24. Gate, g, of transistor 38 receives a control signal PEVpp that has values of approximately 12.5 volts in the program mode and 0 volts in all modes except the programming mode.

In the program mode, transistors 34 and 36 are on to couple power supply Vpp to power bus 24 and transistor 38 is off to disconnect power supply Vcc from power bus 24. In all modes except the programming mode, transistor 38 is on to couple power supply Vcc to power bus 24 and transistors 34 and 36 are off to disconnect power supply Vpp from power bus 24.

Figure 4B:
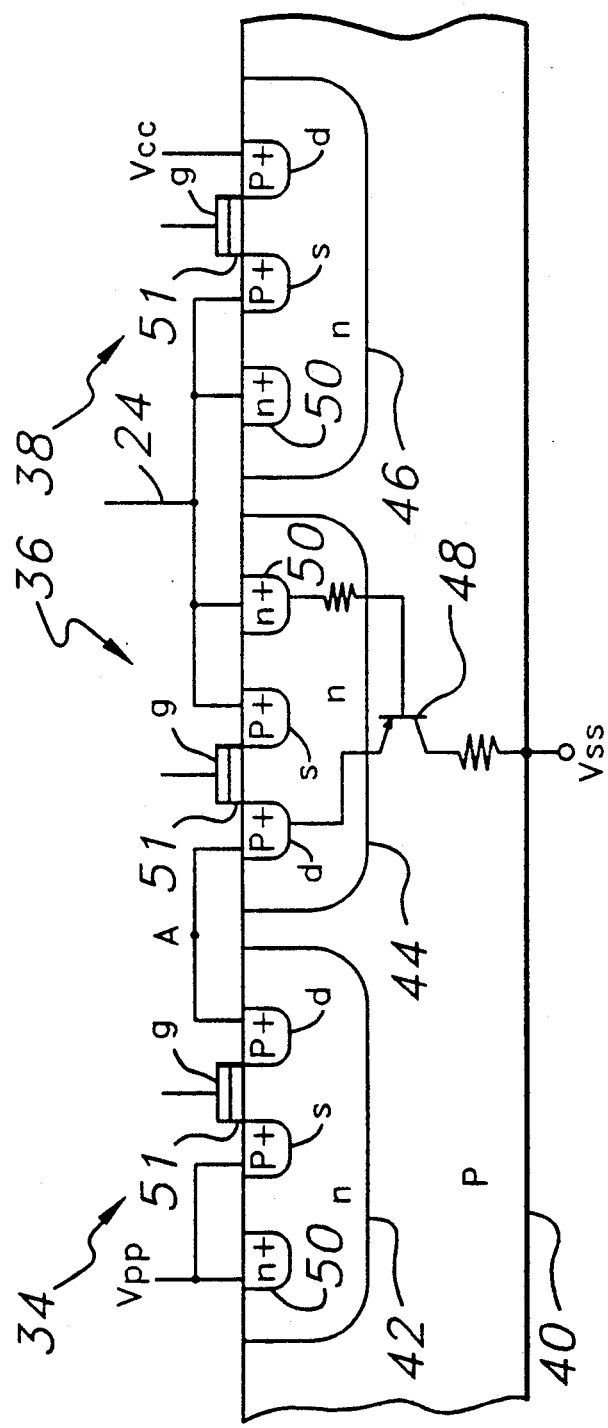

FIG. 4b is a cross-section of a substrate 40 on which the circuit of FIG. 4a is fabricated. N-wells or tanks 42, 44, and 46, are formed in the face of substrate 40, which is of p-type conductivity. N-wells 42, 44, and 46 are the substrate or bulk, b, of transistors 34, 36, and 38, respectively. The sources, s, and drains, d, of transistors 34, 36, and 38 are formed in n-wells 42, 44, and 46, respectively. N+diffusions 50 are also formed in n-wells 42, 44, and 46 for the purpose of connecting n-well substrate 42 to Vpp and n-well substrates 44 and 46 to power bus 24. Gate insulators 51 are formed on the face of substrate 40 and gates, g, of transistors 34, 36, and 38 are formed over gate insulators 51.

The fabrication of transistor 36 results in the formation of parasitic vertical PNP transistor 48. Transistor 48 has a base formed by n-well 44, an emitter formed by drain, d, of transistor 36, and a collector formed by substrate 40. The presence of transistor 48 presents a problem when the program mode is initially entered. This is due to the fact that power bus 24 and the wordline 15 to which it is connected form a long path which must be raised to Vpp in a relatively short time. Power bus 24 thus has a high capacitive loading which results in a significant voltage drop between node A and power bus 24. If the voltage drop exceeds the VBE of transistor 48, transistor 48 will turn on to conduct current needed to charge power bus 24 to Vss instead.

Besides shunting current from transistor 34 to substrate 40 instead of charging power bus 24, transistor 48 may also pose a latchup problem if NMOS devices are formed adjacent to PMOS transistor 36. In such a situation, vertical parasitic PNP transistor 48 would be coupled to a lateral parasitic NPN transistor produced by fabrication of the NMOS device to produce a classic npnp SCR circuit. With transistor 48 conducting, the substrate voltage applied to the base of the lateral parasitic NPN transistor is raised and if it exceeds the VBE of the NPN transistor, the NPN transistor will also turn on and latchup will result. Transistor 48 may also trigger latchup of independent SCRs. Prior techniques to reduce the possibility of latchup include formation of the circuit in an epitaxial layer to reduce the base resistance of the NPN transistor.

Figure 5A:
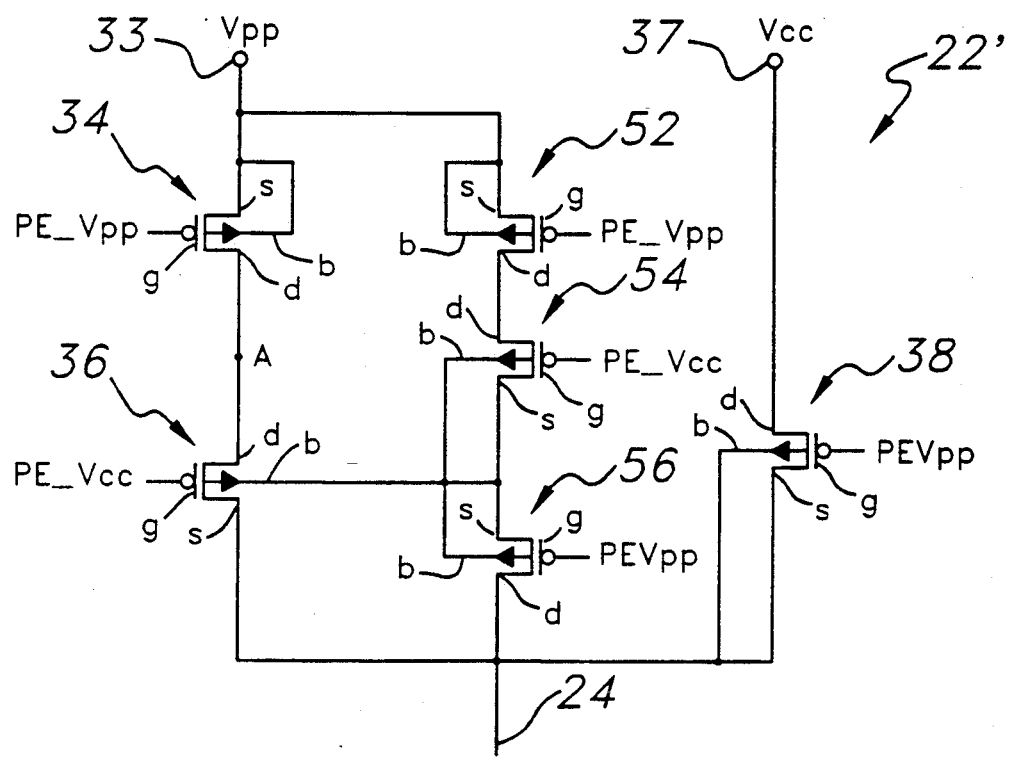
FIG. 5a is a schematic diagram of a first embodiment of a switching circuit according to the present invention.

FIG. 5a shows a Vpp/Vcc switch 22' according to a preferred embodiment of the invention. Switch 22' includes transistors 34, 36, and 38 which have the same connections as in FIG. 4a with the exception of the substrate or bulk connection of transistor 36. In Vpp/Vcc switch 22', substrate or bulk, b, of transistor 36 is connected to a switched bias circuit which includes p-channel MOS field-effect transistors 52, 54, and 56. Transistors 52, 54, and 56 have source-drain paths connected in series between Vpp and power bus 24.

Transistor 52 has a source, s, and substrate or bulk, b, connected together to Vpp and a drain, d, connected to the drain, d, of transistor 54. Gate, g, of transistor 52 receives control signal PE_Vpp. The substrate or bulk, b, and source, s, of transistor 54 are connected in common to the source, s, of transistor 56 and the substrates, b, of transistors 56 and 36. Gate, g, of transistor 54 receives control signal PE_Vcc. The drain, d, of transistor 56 is connected to power bus 24. Gate, g, of transistor 56 receives control signal PEVpp.

FIG. 6 is a timing diagram showing the values of control signals PEVpp, PE_Vpp, and PE_Vcc, which are produced within the EPROM, signals CE_IN, OE_IN, and Vpp, which are supplied to the EPROM from external sources, and the voltage on bus 24. CE_IN is a chip enable complement signal. OE_IN is an output enable complement signal. Vpp is the voltage supplied from an external voltage source. The EPROM is in the program mode from time t1–t2 and is in nonprogramming modes at all other times.

In all modes except the programming mode, transistors 38 and 56 are on and transistors 34, 36, 52, and 54 are off. Vcc in all nonprogramming modes is therefore coupled to power bus 24 by transistor 38 while the substrate, b, of transistor 36 is coupled to power bus 24 by transistor 56. In the program mode, transistors 34, 36, 52, and 54 are on and transistors 38 and 56 are off. Vpp in the program mode is therefore coupled to power bus 24 by transistors 34 and 36.

In Vpp/Vcc switch 22', the substrate or bulk, b, of transistor 36 is driven to Vpp in the program mode by transistors 52 and 54. Since the loading determined by the substrate, b, of transistor 36 is much less than the loading of power bus 24, the switch made up of transistors 52, 54, and 56 will not see an "on" parasitic bipolar transistor that transistors 34, 36, and 38 may activate. This ensures that node A is never greater than a Vbe above substrate, b, of transistor 36 when the program mode is initially entered. The advantage of this arrangement is that the possibility of a forward biased PN junction between the drain, d, and substrate, b, of transistor 36 is eliminated to prevent parasitic PNP transistor 48 from turning on. Transistor 48 will therefore not conduct current to Vss or contribute to latchup by turning on a parasitic lateral NPN transistor. This is particularly significant where substrate 40 is formed from single crystal starting material and is not an epitaxial layer.

Figure 5B:
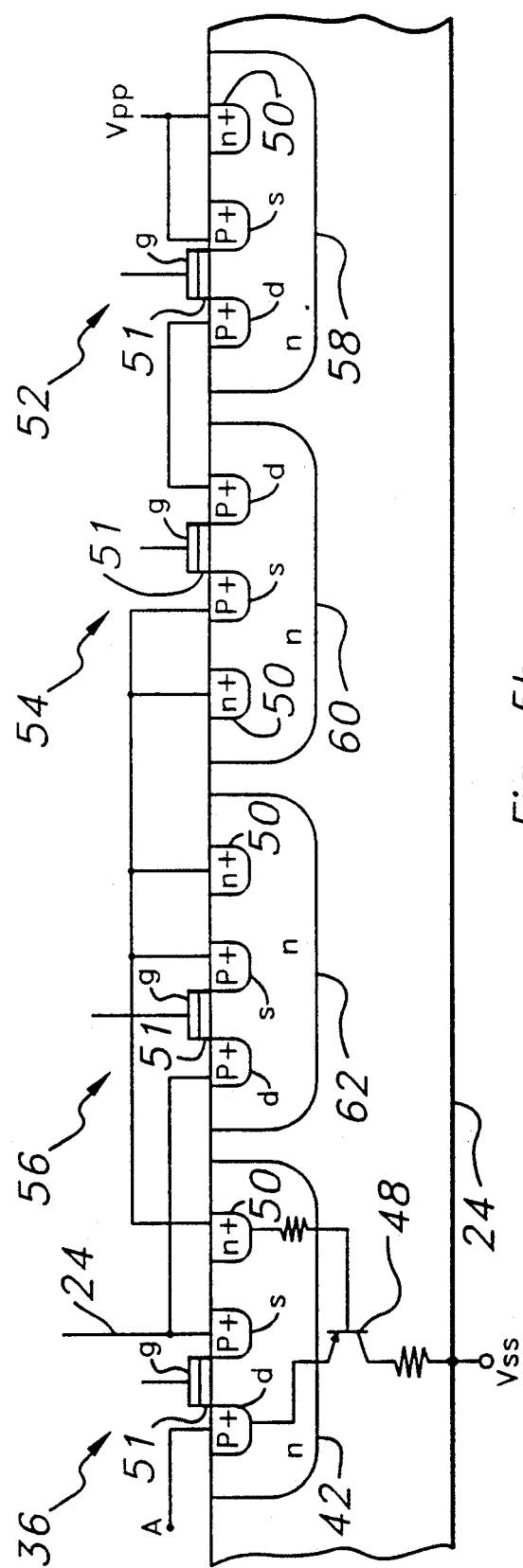

FIG. 5b is a cross-section of a portion of substrate 40 on which the circuit of FIG. 5a is fabricated showing transistors 36, 52, 54, and 56 formed in individual n-wells 42, 58, 60, and 62. N-wells 58, 60, and 62 are the substrates or bulks, b, of transistors 52, 54, and 56, respectively. The n-well 42 or substrate, b, of transistor 36 is connected to the source, s, and substrate, b, of transistor 54 and to the source, s, and substrate, b, of transistor 56. The voltage drop between node A and power bus 24 does not contribute to turning on transistor 48 since n-well 42 is separated from the current path resulting from charging power bus 24 and is independently driven to Vpp by transistors 52 and 54.

Preferred embodiments have been described in detail hereinabove. It is to be understood that the scope of the invention also comprehends embodiments different from those described, yet within the scope of the claims.

For example, switching circuit 22' may be used in integrated circuits other than EPROMs. Two or more of transistors 36, 54, and 56 may be formed in a single n-well. N-channel transistors may be used instead of p-channel transistors. Implementation is contemplated in discrete components or fully integrated circuits in silicon, gallium arsenide, or other electronic materials families.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A switching circuit for selectively coupling a first power to a power bus comprising:
   a first input terminal for connection to the first power supply;
   a coupling circuit for coupling said first input terminal to a first node;

a first transistor having first and second source/drain regions, a gate, and a substrate, said first source/drain region coupled to said first node and said second source/drain region coupled to the power bus, said transistor being on in response to a first control signal applied to said gate to couple said first node to the power bus; and a bias circuit coupled to said substrate of said first transistor to prevent forward biasing of a junction between said substrate and said second source/drain region when said first transistor is on.

2. The switching circuit of claim 1, in which said coupling circuit includes a second transistor having first and second source/drain regions, a gate, and a substrate, said first source/drain region and said substrate of said second transistor being coupled to said first input terminal, said second source/drain region of said second transistor being coupled to said node, said second transistor selectively coupling said first input terminal to said first node in response to control signals applied to said gate of said second transistor.

3. The switching circuit of claim 1, in which said bias circuit couples said substrate to said first input terminal when said first transistor is on and couples said substrate to the power bus when said first transistor is off.

4. The switching circuit of claim 1, in which said bias circuit includes second, third, and fourth transistors having source-drain paths coupled in series between said first input terminal and the power bus, said substrate coupled to a node between the source-drain paths of said third and fourth transistors.

5. The switching circuit of claim 4, in which said second transistor has a first source/drain region and a substrate coupled to said first input terminal.

6. The switching circuit of claim 4, in which said third and fourth transistors have substrates coupled to the substrate of said first transistor.

7. The switching circuit of claim 4, further comprising:

a second input terminal for connection to a second power supply; and a fifth transistor having a source/drain path coupled between said second input terminal and the power bus.

8. The switching circuit of claim 7, in which said fifth transistor has a substrate coupled to the power bus.

9. The switching circuit of claim 8, in which said first, second, and third transistors are on and said fourth and fifth transistors are off in a first mode of operation.

10. A switching circuit for selectively coupling one of a programming voltage source and a read voltage source to a power bus in an electrically-programmable read-only-memory, comprising:

a first input terminal for connection to the programming voltage source;

a second input terminal for connection to the read voltage source;

first and second transistors having source-drain paths coupled in series between said first input terminal and the power bus, said first transistor having a substrate coupled to said first input terminal;

third, fourth, and fifth transistors having source-drain paths coupled in series between said first input terminal and the power bus, said third transistor having a substrate coupled to said first input terminal, said second, fourth, and fifth transistors having substrates coupled to a node between the source-drain path of said fourth transistor and the source-drain path of said fifth transistor;

a sixth transistor having a source-drain path coupled between said second input terminal and the power bus, said sixth transistor having a substrate coupled to the power bus;

said first, second, third, fourth, fifth, and sixth transistors having gates for receiving programming control signals in a program mode and nonprogramming control signals in a nonprogram mode, said first, second, third, and fourth transistors being on and said fifth and sixth transistors being off in response to said programming control signals to couple said first input terminal to the power bus and said substrate of said second transistor, said first, second, third, and fourth transistors being off and said fifth and sixth transistors being on in response to said nonprogramming control signals to couple said second input terminal and said substrate of said second transistor to the power bus.

11. The switching circuit of claim 10, in which said first, second, third, fourth, fifth, and sixth transistors are p-channel field effect transistors.

12. The switching circuit of claim 11, in which said first and fourth transistors have sources coupled to said first input terminal and said second and fifth transistors have drains coupled to the power bus.

* * * * *